PULSE GENERATOR PROVIDING FAST RISE AND FULL TIME PULSES HAVING AN ADJUSTABLE REPETITION RATE OVER A BROAD FREQUENCY RANGE
Filed Nov. 18, 1963
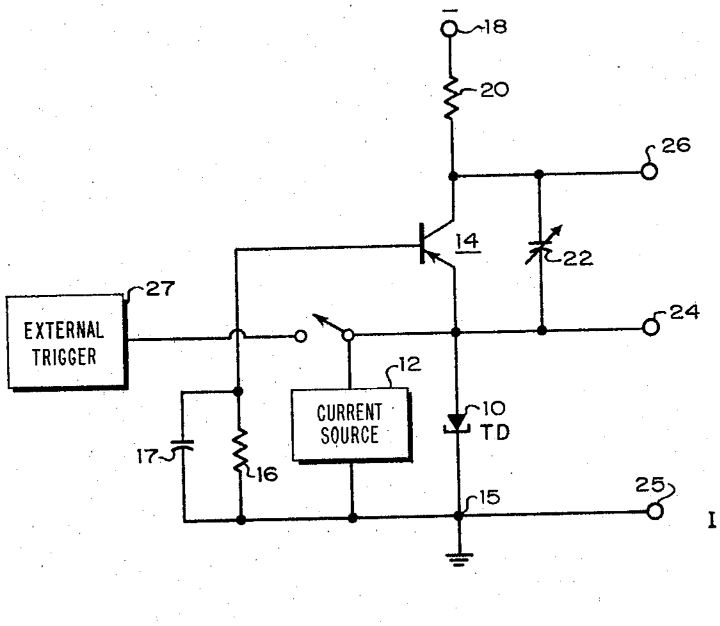
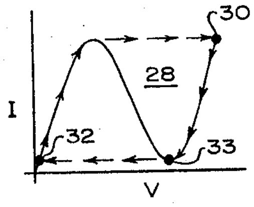
Figure 2
Figure 1
INVENTOR
EMMANUEL E. CANDILIS
BY A. C. Smith
AGENT

United States Patent Office 3,264,494

Patented August 2, 1966

3,264,494

PULSE GENERATOR PROVIDING FAST RISE AND FALL TIME PULSES HAVING AN ADJUSTABLE REPETITION RATE OVER A BROAD FREQUENCY RANGE

Emmanuel E. Candilis, Palo Alto, Calif., assignor to Hewlett-Packard Company, Palo Alto, Calif., a corporation of California

Filed Nov. 18, 1963, Ser. No. 324,488
10 Claims. (Cl. 307—88.5)

This invention relates to pulse forming circuits which use solid state elements to generate fast rise and fall time pulses having a repetition rate which is adjustable over a broad frequency range.

Conventional pulse generators which produce fast rise and fall time pulses generally provide a maximum range of repetition rates between a few cycles per second and a hundred megacycles per second. Typically, the units which provide pulses with very fast rise and fall times, of the order of one or two nanoseconds, have a more limited range of repetition rates. Many applications in electronics, especially in the field of computers, require very fast rise and fall time pulses and a greater range of repetition rates.

Accordingly, it is an object of this invention to provide a pulse forming circuit to generate very fast rise and fall time pulses having a repetition rate which is adjustable over a greater frequency range.

In accordance with the illustrated embodiment of this invention a tunnel diode which is shunted by a current source is included in the common portion of the input and output circuits of a transistor. With the transistor initially in a non-conductive state the current source biases the tunnel diode for operation in its high voltage region of positive resistance. This voltage across the tunnel diode is sufficient to switch the transistor to a conductive state. In its conductive state the transistor begins drawing current from the current source. However, this decreases the current flow through the tunnel diode, thereby causing it to switch rapidly to operation in its low voltage region of positive resistance. The decreased voltage across the tunnel diode is insufficient to maintain the transistor in its conductive state. Thus, the transistor switches back to its non-conductive state and the tunnel diode again begins to draw the current from the current source. The tunnel diode generates a very fast rise and fall time pulse having a high repetition rate in response to the current switching between the tunnel diode and the transistor. The pulse repetition rate is made adjustable over a broad frequency range by connecting a variable capacitor between the input and the output of the transistor.

Other and incidental objects of this invention will be apparent from a reading of this specification and an inspection of the accompanying drawings in which:

FIGURE 1 is a schematic diagram of a pulse forming circuit according to this invention; and FIGURE 2 shows the current-voltage characteristic of the tunnel diode of FIGURE 1.

Referring to FIGURES 1 and 2, there is shown a tunnel diode 10 which is shunted by a current source 12. The tunnel diode 10 is connected by its anode electrode to the emitter electrode of a transistor 14 and by its cathode electrode to a point of reference potential 15, for example, ground. A resistor 16, which is shunted by a capacitor 17, connects the base electrode of the transistor 14 to the point of reference potential 15. The collector electrode of the transistor 14 is connected to a voltage source 18 by the resistor 20. A variable capacitor 22 is connected between the collector and the emitter electrodes of the transistor 14. Output terminal 24 and ground terminal 25 are connected to receive the signal appearing across the tunnel diode 10. Alternatively, output terminals 26 and 24 are connected to receive the signal appearing across the transistor 14.

In operation the transistor 14 is initially in a non-conductive state. The variable capacitor 22 is initially charged to a value fixed by the voltage drops around its charging circuit which comprises the variable capacitor 22, the resistor 20, the voltage source 18, and the tunnel diode 10. The tunnel diode 10 shows in its current-voltage characteristic 28 a region of negative resistance between adjacent low and high voltage regions of positive resistance. Sufficient current is supplied by the current source 12 to bias the tunnel diode 10 for operation at a value 30 in its high voltage region of positive resistance. This value of voltage must be sufficient to switch the transistor 14 to a conductive state. To help the transistor 14 become conductive rapidly the base resistor 16 is shunted by the speed-up capacitor 17.

In its conductive state the transistor 14 draws current from the current source 12 and the variable capacitor 22. The variable capacitor 22 discharges towards the value of the collector to emitter voltage of the transistor 14 which corresponds to the maximum emitter current that can be drawn from the current source 12. (The maximum current supplied by the current source 12 should be less than the emitter current required for saturation of the transistor 14 to minimize the switching speed thereof.) As the variable capacitor 22 discharges, the transistor 14 draws an increasing amount of current from the current source 12. Accordingly, the tunnel diode 10 draws a decreasing amount of current from the current source 12. Ultimately, the variable capacitor 22 stops discharging and the transistor 14 draws substantially all the current from the current source 12. This causes the tunnel diode 10 to switch to operation at a value 32 in its low voltage region of positive resistance. However, this value of voltage is insufficient to maintain the transistor 14 in its conductive state. Thus, the transistor 14 switches to a non-conductive state. The voltage 33 must be greater than the base to emitter voltage required to maintain the transistor 14 in a conductive state. This prevents the transistor 14 from switching to a non-conductive state before the tunnel diode has switched to operation in its low voltage region of positive resistance.

With the transistor 14 in a non-conductive state the tunnel diode 10 again begins to draw current from the current source 12. The variable capacitor 22 also draws current from the current source 12 and charges towards a value fixed by the voltage drops around its charging circuit. As the variable capacitor 22 approaches this value, the tunnel diode 10 draws an increasing amount of current from the current source 12. Ultimately, the variable capacitor 22 stops charging and the tunnel diode 10 draws all of the current from the current source 12. This amount of current is sufficient to switch the tunnel diode 10 to operation at a value 30 in its high voltage region of positive resistance, thereby initiating the next cycle of operation.

The current switching between the tunnel diode 10 and the transistor 14 causes the tunnel diode 10 to generate a very fast rise and fall time pulse. Its rise and fall times are minimized since the transistor does not saturate, and are each of the order of one nanosecond. The repetition rate of this pulse is fixed by the charging and discharging time constants of the variable capacitor 22. Therefore, the variable capacitor 22 provides a pulse repetition rate which is adjustable over a broad frequency range from a few cycles per second to approximately three hundred megacycles per second. This feature of applicant's invention makes it useful as a frequency or pulse modulator. Since a tunnel diode is used to generate the very fast rise and fall time pulses, the circuit of applicant's invention has a very low jitter. In addition it is very stable as the pulse repetition rate, once selected, is only affected by the switching speed of the solid state elements.

Applicant's invention is not limited to the exact details disclosed, but may be embodied in other forms. For example, the transistor 14 and the tunnel diode 10 may be placed in different configurations to realize the same results. Though a free-running mode of operation has been described, the pulse forming circuit of this invention may also be externally triggered. This is achieved by adjusting the current source 12 to supply slightly less than the current necessary for the tunnel diode to operate in its high voltage region of positive resistance. The additional current required to actuate the pulse forming mechanism of the circuit is then supplied by an external trigger represented by the block 27. When the pulse forming circuit is externally triggered, the pulse width can be determined by the variable capacitor 22 or a shorted delay line inserted in the circuit including the tunnel diode 10 and the transistor 14.

I claim:

1. A pulse generator comprising:
a transistor having a plurality of electrodes,
means including first and second electrodes of said transistor forming an input circuit for said transistor,
a voltage source,
means including second and third electrodes of said transistor serially connected to said voltage source and forming an output circuit for said transistor,
said input and output circuits having a common portion between said second electrode and a point of reference potential,
a circuit element which shows in its current-voltage characteristic a region of negative resistance between adjacent low and high voltage regions of positive resistance,
said circuit element being connected in the common portion of said input and output circuits,
a current source connected in shunt with said circuit element for biasing said circuit element to operate in its high voltage region of positive resistance,
said transistor switching to a conductive state and thereby drawing current from said current source in response to operation of said circuit element in its high voltage region of positive resistance,
said circuit element switching to operation in its low voltage region of positive resistance in response to the decreased current flowing through said circuit element when said transistor is operating in its conductive state,
said transistor switching to a non-conductive state in response to operation of said circuit element in its low voltage region of positive resistance,
said current source biasing said circuit element for operation in its high voltage region of positive resistance in response to the non-conductive state of said transistor,
said circuit element generating a pulse in response to the current switching between said circuit element and said transistor.

2. A pulse generator as in claim 1 wherein energy storage means are connected between the second and third electrodes of said transistor.

3. A pulse generator comprising:
a transistor having a plurality of electrodes,
means including first and second of said electrodes forming an input circuit,
means including second and third of said electrodes forming an output circuit,
said input and output circuits having a common portion between said second electrode and a point of reference potential,
a source of bias voltage for said transistor connected to said output circuit,
a tunnel diode which shows in its current-voltage characteristic a region of negative resistance between adjacent low and high voltage regions of positive resistance,
said input and output tunnel diode being connected in the common portion of said circuits,
one end of said tunnel diode being connected to the point of reference potential,
a current source connected in shunt with said tunnel diode for biasing said tunnel diode to operate in said high voltage region of positive resistance,
said transistor switching to a conductive state and thereby drawing current from said current source in response to the voltage across said tunnel diode,
said tunnel diode switching to operation in said low voltage region of positive resistance in response to the decreased current flowing through said tunnel diode,
said transistor switching to a non-conductive state in response to the decreased voltage across said tunnel diode,
said current source biasing said tunnel diode for operation in said high voltage region of positive resistance in response to the non-conductive state of said transistor,
said tunnel diode generating a pulse in response to the current switching between said tunnel diode and said transistor,
a variable storage element connecting the other end of said tunnel diode and the third electrode of said transistor,
said variable storage element providing said pulse with an adjustable repetition rate.

4. A pulse forming circuit comprising:
a transistor of one conductivity type having first, second, and third electrodes,
a point of reference potential,
a network including a resistance element connecting said first electrode to said point of reference potential,
a voltage source having output terminals,
means including said voltage source connecting said third electrode and said point of reference potential,
said means including a resistive element connecting said third electrode and one terminal of said voltage source,
a tunnel diode having anode and cathode electrodes and showing in its current-voltage characteristic a region of negative resistance between adjacent low and high voltage regions of positive resistance,
said anode electrode being connected to the second electrode of said transistor,
said cathode electrode being connected to said point of reference potential,
a direct current source.
circuit means connecting said direct current source in shunt with said tunnel diode for biasing said tunnel diode to operate in said high voltage region of positive resistance,
said transistor switching to a conductive state and thereby drawing current from said current source in response to the voltage across said tunnel diode,
said tunnel diode switching to operation in said low voltage region of positive resistance in response to the decreased current flowing through said tunnel diode,
said transistor switching to a non-conductive state in response to the decreased voltage across said tunnel diode,
said current source biasing said tunnel diode for operation in said high voltage region of positive resistance in response to the non-conductive state of said transistor, said tunnel diode generating a pulse in response to its switching between said high and low voltage regions of positive resistance, variable capacitance means connecting the second and third electrodes of said transistor, said variable capacitance means providing said pulse with an adjustable repetition rate.

5. A pulse forming circuit as in claim 4 wherein said transistor is connected in the common base configuration and said first, second, and third electrodes are respectively base, emitter, and collector electrodes.

6. A pulse generator comprising:

a transistor having a plurality of electrodes, means including first and second electrodes of said transistor forming an input circuit for said transistor, a voltage source, means including second and third electrodes of said transistor serially connected to said voltage source and forming an output circuit for said transistor, said input and output circuits having a common portion between said second electrode and a point of reference potential, a circuit element which shows in its current-voltage characteristic a region of negative resistance between adjacent low and high voltage regions of positive resistance, said circuit element being connected in the common portion of said input and output circuits, a current source connected in shunt with said circuit element for biasing said circuit element to operate in its low voltage region of positive resistance, said circuit element switching to operation in its high voltage region of positive resistance in response to a trigger signal, said transistor switching to a conductive state and thereby drawing current from said current source in response to operation of said circuit element in its high voltage region of positive resistance, said circuit element switching to operation in its low voltage region of positive resistance in response to the decreased current flowing through said circuit element when said transistor is operating in its conductive state, said transistor switching to a non-conductive state in response to operation of said circuit element in its low voltage region of positive resistance, said current source biasing said circuit element for operation in its low voltage region of positive resistance in response to the non-conductive state of said transistor, said circuit element generating a pulse in response to the current switching between said circuit element and said transistor,

7. A pulse generator as in claim 6 wherein energy storage means are connected between the second and third electrodes of said transistor.

8. A pulse generator comprising:

a transistor having a plurality of electrodes, means including first and second electrodes of said transistor forming an input circuit for said transistor, a voltage source, means including second and third electrodes of said transistor serially connected to said voltage source and forming an output circuit for said transistor, said input and output circuits having a common portion between said second electrode and a point of reference potential, a circuit element which shows in its current-voltage characteristic a region of negative resistance between adjacent low and high voltage regions of positive resistance, said circuit element being connected in the common portion of said input and output circuits, a current source connected in shunt with said circuit element for biasing said circuit element to operate in its low voltage region of positive resistance, a trigger circuit, said circuit element switching to operation in its high voltage region of positive ressitance in response to a trigger signal generated by said trigger circuit, said transistor switching to a conductive state and thereby drawing current from said current source in response to operation of said circuit element in its low voltage region of positive resistance, said circuit element switching to operation in its low voltage region of positive resistance in response to the decreased current flowing through said circuit element when said transistor is operating in its conductive state, said transistor switching to a nonconductive state in response to operation of said circuit element in its low voltage region of positive resistance, said current source biasing said circuit element for operation in its low voltage region of positive resistance in response to the nonconductive state of said transistor, said circuit element generating a pulse in response to the current switching between said circuit element and said transistor.

9. A pulse generator comprising:

a transistor having base, emitter, and collector electrodes and being connected in the common base configuration, a circuit element which shows in its current-voltage characteristic a region of negative resistance between adjacent low and high voltage regions of positive resistance, means including the base and emitter electrodes of said transistor serially connected to said circuit element and forming an input circuit for said transistor, a voltage source, means including the emitter and collector electrodes of said transistor serially connected to said voltage source and forming an output circuit for said transistor, a current source connected in shunt with said circuit element for biasing said circuit element to operate in its low voltage region of positive resistance, said circuit element switching to operation in its high voltage region of positive resistance in response to a trigger signal, said transistor switching to a conductive state and thereby drawing current from said current source in response to the increased voltage across said circuit element, said circuit element switching to operation in its low voltage region of positive resistance in response to the decreased current flowing through said circuit element, said transistor switching to a non-conductive state in response to the decreased voltage across said circuit element, said current source biasing said circuit element for operation in its low voltage region of positive resistance in response to the non-conductive state of said transistor, said circuit element generating a pulse in response to the current switching between said circuit element and said transistor, and storage means connected between the emitter and collector electrodes of said transistor.

10. A pulse generator comprising:

a transistor including first, second, and third electrodes and having a conductive state and a nonconductive state, means including said first and second electrodes of said transistor forming an input circuit for said transistor, a voltage source, means including said second and third electrodes of said transistor and being serially connected to said voltage source for forming an output circuit for said transistor, a point of reference potential, said input and output circuits having a common portion between said second electrode and said point of reference potential, a circuit element which shows in its current-voltage characteristic a region of negative resistance between adjacent low and high voltage regions of positive resistance, said circuit element being connected in the common portion of said input and output circuits, energy storage means connected between said second and third electrodes of said transistor, biasing means including a current source connected in shunt with said circuit element for biasing said circuit element to operate in one of its voltage regions of positive resistance when said transistor is in said nonconductive state, said transistor switching to said conductive state and thereby drawing current from said current source in response to operation of said circuit element in said one voltage region of positive resistance, said circuit element switching to operation in the other of its voltage regions of positive resistance in response to the decreased current flowing through said circuit element when said transistor is operating in said conductive state, said transistor switching to said nonconductive state in response to operation of said circuit element in said other voltage region of positive resistance, and said circuit element generating a pulse in response to the current switching between said circuit element and said transistor.

References Cited by the Examiner

UNITED STATES PATENTS

| | | | |
|---|---|---|---|
| 3,150,273 | 9/1964 | Dym | 307—88.5 |
| 3,191,065 | 6/1965 | Vargiu | 307—88.5 |

OTHER REFERENCES

"Nanosecond High Current Pulse Circuit," RCA Technical Notes, RCN TN No. 524, March 1962.

ARTHUR GAUSS, *Primary Examiner.*

S. D. MILLER, *Assistant Examiner.*